United States Patent [19]
Kawagishi et al.

[11] Patent Number: 4,940,608
[45] Date of Patent: Jul. 10, 1990

[54] LOCAL ELECTROLESS PLATING PROCESS FOR PLASTICS

[75] Inventors: Shigemitsu Kawagishi, Suita; Toshiyuki Kita, Nara, both of Japan

[73] Assignee: Okuno Chemical Industry Co., Ltd., Japan

[21] Appl. No.: 268,051

[22] Filed: Nov. 7, 1988

[51] Int. Cl.$^5$ .......................... B05D 5/00; B05D 1/32; B05D 3/10
[52] U.S. Cl. ..................................... 427/259; 427/304; 427/306; 427/307; 427/443.1
[58] Field of Search ................. 427/304, 98, 306, 259, 427/307, 443.1

[56] References Cited

U.S. PATENT DOCUMENTS 4,268,610  5/1981  Root ............................. 427/98 X
4,293,592 10/1981  Morishita et al. ................ 427/98
4,782,007 11/1988  Ferrier ........................ 427/306 X Primary Examiner—Evan K. Lawrence
Attorney, Agent, or Firm—Timothy R. Kroboth

[57] ABSTRACT

A local electroless plating process for plastics comprising the steps of: coating the nonplating surface portion of a shaped plastic product with a pasty masking composition comprising a polymer and at least one compound selected from the group consisting of a sulfur compound, nitrogen compound and silicon compound; roughening the surface portion of the plastics product to be plated and applying a catalyst to the rough-surfaced portion; electrolessly plating the plastics product; and removing the polymer coating from the nonplating surface portion of the plastics product.

18 Claims, No Drawings

LOCAL ELECTROLESS PLATING PROCESS FOR PLASTICS

TECHNICAL FIELD

The present invention relates to a process for electrolessly plating plastics products locally.

BACKGROUND OF THE INVENTION

Plastics products are locally electrolessly plated generally by the following methods.

(a) A tape prepared by coating a base sheet of polyester or the like with an adhesive is affixed to the portion of the product not to be plated ("hereinafter referred to as a "nonplating portion"), the product is then electrolessly plated, and the tape is thereafter removed.

(b) A masking agent comprising a polyvinyl chloride sol is applied to the nonplating portion of the product, followed by electroless plating and removal of the masking coating.

(c) The method comprising electrolessly plating the product in its entirety, coating the desired plated portion with a resist and removing the plating from the nonplating portion by dissolving.

However, these methods have the problem of being low in efficiency and permitting the coating to remain to impair the precision or appearance of the resulting product and lower the commercial value of the product. Furthermore, these methods are not always applicable to articles of complex configuration since the coating is difficult to remove completely.

DISCLOSURE OF THE INVENTION

Accordingly, an object of the present invention is to provide an efficient process for electrolessly plating plastics products locally.

Another object of the invention is to provide a process for preparing locally electrolessly plated products with high precision and with an excellent appearance.

Still another object of the invention is to provide a local electroless plating process which is usable also for complex products of plastics.

Other objects and features of the invention will become apparent from the following description.

The present invention provides a local electroless plating process for plastics comprising the steps of:

(1) coating the nonplating surface portion of a shaped plastic product with a pasty masking composition comprising a polymer and at least one of a sulfur compound, nitrogen compound and silicon compound, (2) roughening the surface portion of the plastics product to be plated and applying a catalyst to the rough-surfaced portion, (3) electrolessly plating the plastics product, and (4) thereafter removing the polymer coating from the nonplating surface portion of the plastics product.

The present invention further provides a local electroless plating process for plastics comprising the steps of:

(1) coating the nonplating surface portion of a shaped plastics product with a pasty masking composition comprising a polymer and at least one of a sulfur compound, nitrogen compound and silicon compound, (2) roughening the surface portion of the plastics product to be plated and applying a catalyst to the rough-surfaced portion, (3) thereafter removing the polymer coating from the nonplating surface portion of the plastics product, and (4) electrolessly plating the plastics product.

Our research has revealed that when shaped plastics products are electrolessly plated with the nonplating surface portions thereof masked with a composition comprising at least one of a specified sulfur compound, nitrogen compound and silicon compound, the plating process achieves the following advantages. The masking coating can be removed easily after the plating without entailing any likelihood of impairing the resulting product, the plating can be formed with high accuracy, and the process is applicable also to products of complex configuration. The present invention has been accomplished based on the above finding.

The plastics product to be treated by the process of the invention is any of the shaped plastics products or plastics moldings heretofore plated electrolessly. Typical of such plastics are, for example, acrylonitrile-butadiene-styrene (ABS) resin, polyamide resin, polycarbonate resin, polycarbonate-ABS alloy, polybutylene terephthalate, Noryl resin, polyethylene resin, polyacetal resin, etc. However, the invention is not limited to these resins.

Examples of useful polymer components of the masking composition are modified unsaturated polyester resin, modified unsaturated acrylic resin, alkyd-modified acrylic resin, urethane-modified acrylic resin, etc.

Examples of sulfur compounds, nitrogen compounds and silicon compounds for use with the polymer component of the masking composition are given below. These compounds may be used singly, or at least two of them are usable in combination.

Sulfur compound: potassium xanthate, potassium dibutyldithiocarbamate, thiourea and like thiourea derivatives, thioethanol, mercaptobenzothiazole, mercaptobenzodiol, thiosemicarbazide, thioglycollic acid, mercaptan and the like.

Nitrogen compound: triazole, benzotriazole and like benzotriazole derivatives, etc.

Silicon compound: mercaptopropyltrimethoxysilane, methyltriethoxysilane, aminosilane, trimethylchlorosilane, vinyltriethoxysilane and the like.

The masking composition to be used in the invention is a paste prepared using at least one solvent, e.g. an alcohol such as ethanol, methanol or isopropanol, a ketone such as methyl ethyl ketone, acetone or the like and comprising 10 to 50 wt.% of at least one of the polymer components exemplified above, and 0.1 to 10 wt.% of at least one of the sulfur compounds, nitrogen compounds and silicon compounds given above.

In practicing the process of the invention, the nonplating portion of the shaped plastics product to be plated is first coated with the masking composition. The coating method is not limited specifically; the composition is applicable, for example, by immersion, brush coating or spraying.

Next, the surface portion of the plastics product to be plated is roughened or etched by a usual method to enable the electroless plating film to adhere to the plastics product effectively. The roughening or etching agent to be used is one conventionally used. For example, it is a mixture of 200 to 400 g/liter of a chromate (chromic anhydride, sodium dichromate or the like) and 400 to 700 g/liter of 98% sulfuric acid. The plastics product is immersed in an etching agent mixture at about 60° to about 70° C. for about 2 to about 10 minutes, thereafter neutralized, for example, with a solution of 40 to 70 ml/liter of 35% hydrochloric acid and washed with water. When the plastics product is made of polycarbonate or polybutylene terephthalate, surface roughening may be followed by the application of the masking composition. When the product is made of polyamide, it is desirable to immerse the product in a solution of 180 to 250 ml/liter of hydrochloric acid and the roughening agent at about 25 to about 50° C. for about 5 to about 15 minutes, followed by neutralization with 2 to 8 g/liter of sodium hydroxide at about 10° to about 35° C. for about 1 to about 2 minutes and washing with water.

A catalyst is applied to the plastics product also by a usual method. For example, the product is immersed in a solution of about 0.1 to about 0.2 g/liter of $PdCl_2$, about 10 to about 20 g/liter of stannous chloride and about 90 to about 150 ml/liter of 35% hydrochloric acid and then washed with water.

When the product is to be electrolessly plated with nickel, the product having the catalyst applied thereto is sensitized by a usual method before plating. The activator to be used is, for example, 5 to 10 wt.% sulfuric acid or 3 to 6 wt.% hydrochloric acid. The electroless nickel plating bath, which can be of a known composition, is used at a pH of about 4.5 to about 7.5, preferably about 6.8 to about 7.3, as already known.

The nickel-plated plastics product is then immersed in absolute ethanol, absolute methanol, or a mixture of 85 to 90% ethanol or methanol and 15 to 10% of 25% ammonia water to remove the masking layer. When required, the product is thereafter washed with water to obtain the desired plated product.

When the plastics product is to be electrolessly plated with copper, the product having the catalyst applied thereto is immersed, for example, in absolute ethanol, absolute methanol, or a mixture of 85 to 90% ethanol or methanol and 15 to 10% of 25% ammonia water to remove the masking layer.

The plastics product bearing the catalyst and having the masking layer removed therefrom is then sensitized by a usual method and thereafter plated with copper electrolessly. For example, 5 to 10 wt.% sulfuric acid or the like is used as the activator. The electroless copper plating bath, which can be of a known composition, is used at a pH of about 12 to about 13, preferably about 12.3 to about 12.6, as already known.

To inhibit the corrosion of the copper plating layer, the layer may be subsequently plated with nickel electrolessly by a known method.

EXAMPLES

For a better understanding of the features of the invention, examples are given below.

In the following description, the parts and percentages are all by weight.

EXAMPLE 1

Sixty parts of modified acrylic resin (trademark "Metalex Crown B," product of Nippon Oils & Fats Co., Ltd.), 0.3 part of potassium xanthate and 39.7 parts of ethanol were mixed together to obtain a polymer paste (hereinafrer referred to as "masking composition"), which was then applied to a half portion of each of opposite surfaces of a specimen (7.5 cm×15 cm×0.3 cm) molded of ABS resin (trademark "Kralastic AP-8", product of Sumitomo Naugatuck Co., Ltd.) and dried at 60° C. for 1 hour.

Next, the specimen was immersed in a solution of 400 g/liter of $CrO_3$ and 400 g/liter of $H_2SO_4$ at 65° C. for 3 minutes for surface roughening, then washed with water, thereafter immersed in a solution of 50 ml/liter of 36% HCl at room temperature for 1 minute for neutralization and finally washed with water.

Subsequently, the specimen was immersed in a catalyst solution containing 0.1 g/liter of $PdCl_2$, 10 g/liter of $SnCl_2 \cdot 2H_2O$ and 100 ml/liter of 36% HCl at room temperature for 3 minutes and then washed with water.

The specimen was immersed in a solution of 100 ml/liter of 36% HCl at 35° C. for 4 minutes, washed with water, then immersed in an electroless nickel plating bath (as adjusted to a pH of 7.5 with sulfuric acid) composed of 20 g/liter of $NiSO_4 \cdot 6H_2O$, 15 g/liter of $NaH_2PO_2 \cdot H_2O$, 40 g/liter of sodium citrate and 30 ml/liter of 25% $NH_4OH$ at 45° C. for 10 minutes and thereafter washed with water.

The specimen was immersed in a solution composed of 90 vol.% of ethanol and 10 vol.% of 25% $NH_4OH$ at 30° C. for 10 minutes to remove the masking layer.

The nickel-plated test piece thus obtained was free from any nickel deposit over the masked portion and had a very beautiful appearance. The test piece had a distinct boundary line between the masked portion and the plated portion and was therefore plated with high accuracy.

EXAMPLE 2

Forty parts of modified acrylic resin (trademark "Metalex Crown B," product of Nippon Oils & Fats Co., Ltd.), 5 parts of mercaptotrimethoxysilane, 0.1 part of mercaptobenzodiol and 54.9 parts of isopropanol were mixed together to prepare a masking composition, which was then sprayed twice onto a half portion of each of opposite surfaces of a specimen (6 cm×9 cm×0.3 cm) molded of Noryl resin (trademark "Noryl PN-235," product of Engineering Plastics Co., Ltd.) and dried at 70° C. for 2 hours.

Next, the specimen was immersed in a solution of 400 g/liter of $CrO_3$ and 400 g/liter of $H_2SO_4$ at 65° C. for 5 minutes for surface etching, then washed with water and thereafter treated in the same manner as in Example 1.

The nickel-plated test piece thus obtained was free from any nickel deposit over the masked portion and had a very beautiful appearance. The test piece further had a distinct boundary line between the masked portion and the plated portion and was therefore plated with high accuracy.

EXAMPLE 3

The same molded specimen of ABS resin as used in Example 1 was immersed for 1 minute in a masking composition composed of 50 parts of urethane-modified acrylic resin (trademark "F-CO Resin F-600," product of Kanei Sangyo Co., Ltd.), 1 part of vinyltriethoxysilane, 0.5 part of benzotriazole and 48.5 parts of ethanol to mask a half portion of each of opposite surfaces of the specimen with the composition. The specimen was then allowed to stand at room temperature for 20 minutes and thereafter dried at 60° C. for 1 hour.

Next, the specimen was immersed in a solution of 400 g/liter of $CrO_3$ and 400 g/liter of $H_2SO_4$ at 60° C. for 4 minutes for surface roughening, then washed with water, further immersed in a solution of 50 ml/liter of 36% HCl at room temperature for 1 minute for neutralization and thereafter washed with water.

The resulting specimen was immersed in the same catalyst solution as used in Example 1 at 35° C. for 5 minutes and washed with water.

Subsequently, the specimen was immersed in a mixture of equal amounts of methanol and ethanol while being shaken to remove the masking composition, and was thereafter washed with water.

The specimen was then immersed in 10% sulfuric acid at 40° C. for 3 minutes, washed with water, thereafter immersed in an electroless copper plating bath (as adjusted to a pH of 12.6 with NaOH) composed of 10 g/liter of $CuSO_4 \cdot 5H_2O$, 5 g/liter of HCHO, 40 g/liter of Rochelle salt and 0.5 g/liter of thiourea at 25° C. for 30 minutes and finally washed with water.

The test piece thus obtained was free from any copper deposit over the masked portion and had a very beautiful appearance. The test piece had a distinct boundary line between the masked portion and the plated portion and was therefore plated with high accuracy.

We claim:

1. A local electroless plating process for plastics comprising the steps of:
   (1) coating the nonplating surface portion of a shaped plastics product with a pasty masking composition comprising a polymer and at least one compound selected from the group consisting of a sulfur compound, nitrogen compound and silicon compound;
   (2) roughening the surface portion of the plastics product to be plated and applying a catalyst to the rough-surfaced portion;
   (3) electrolessly plating the plastics product; and
   (4) thereafter removing the polymer coating from the nonplating surface portion of the plastics product by use of absolute ethanol, absolute methanol, or a mixture of 85 to 90% ethanol or methanol and 15 to 10% of 25% ammonia water;
   wherein the sulfur compound contained in the masking composition, is at least one compound selected from the group consisting of potassium xanthate, potassium dibutyldithiocarbamate, thiourea, thiourea derivatives, thioethanol, mercaptobenzothiazole, mercaptobenzodiol, thiosemicarbazide, thioglycollic acid and mercaptan;
   wherein the nitrogen compound contained in the masking composition, is at least one compound selected from the group consisting of triazole, benzotriazole and benzotriazole derivatives; and
   wherein the silicon compound contained in the masking composition, is at least one compound selected from the group consisting of mercaptopropyltrimethoxysilane, methyltriethoxysilane, aminosilane, trimethylchlorosilane and vinyltriethoxysilane.

2. A process as defined in claim 1 wherein the polymer component of the masking composition is at least one resin selected from the group consisting of modified unsaturated polyester resin, modified unsaturated acrylic resin, alkyd-modified acrylic resin and urethane-modified acrylic resin.

3. A process as defined in claim 1 wherein the masking composition contains at least one solvent selected from the group consisting of ethanol, methanol, isopropanol, methyl ethyl ketone and acetone.

4. A process as defined in claim 1 wherein the masking composition comprises 10 to 50 wt.% of the polymer, 0.1 to 10 wt.% of at least one compound selected from the group consisting of a sulfur compound, nitrogen compound and silicon compound, and the balance a solvent.

5. The process of claim 1, wherein nickel is electrolessly plated.

6. The process of claim 1, wherein said catalyst is lead.

7. The process of claim 1, wherein the coating removal step uses said mixture of 85 to 90% ethanol or methanol and 15 to 10% of 25% ammonia water.

8. A local electroless plating process for plastics comprising the steps of:
   (1) coating the nonplating surface portion of a shaped plastics product with a pasty masking composition comprising a polymer and at least one compound selected from the group consisting of a sulfur compound, nitrogen compound and silicon compound;
   (2) roughening the surface portion of the plastics product to be plated and applying a catalyst to the rough-surfaced portion;
   (3) removing the polymer coating from the nonplating surface portion of the plastics product by use of absolute ethanol, absolute methanol, or a mixture of 85 to 90% ethanol or methanol and 15 to 10% of 25% ammonia water; and
   (4) thereafter electrolessly plating the plastics product;
   wherein the sulfur compound contained in the masking composition, is at least one compound selected from the group consisting of potassium xanthate, potassium dibutyldithiocarbamate, thiourea, thiourea derivatives, thioethanol, mercaptobenzothiazole, mercaptobenzodiol, thiosemicarbazide, thioglycollic acid and mercaptan;
   wherein the nitrogen compound contained in the masking composition, is at least one compound selected from the group consisting of triazole, benzotriazole and benzotriazole derivatives; and
   wherein the silicon compound contained in the masking composition, is at least one compound selected from the group consisting of mercaptopropyltrimethoxysilane, methyltriethoxysilane, aminosilane, trimethylchlorosilane and vinyltriethoxysilane.

9. A process as defined in claim 8 wherein the polymer component of the masking composition is at least one resin selected from the group consisting of modified unsaturated polyester resin, modified unsaturated acrylic resin, alkyd-modified acrylic resin and urethane-modified acrylic resin.

10. A process as defined in claim 8 wherein the masking composition contains at least one solvent selected from the group consisting of ethanol, methanol, isopropanol, methyl ethyl ketone and acetone.

11. A process as defined in claim 8 wherein the masking composition comprises 10 to 50 wt.% of the polymer, 0.1 to 10 wt.% of at least one compound selected from the group consisting of a sulfur compound, nitrogen compound and silicon compound, and the balance a solvent.

12. The process of claim 8, wherein copper is electrolessly plated.

13. The process of claim 8, wherein said catalyst is lead.

14. The process of claim 8, wherein the coating removal step uses said mixture of 85 to 90% ethanol or methanol and 15 to 10% of 25% ammonia water.

15. A local electroless plating process for plastics comprising the steps of:
  (1) coating the nonplating surface portion of a shaped plastics product with a pasty masking composition comprising a polymer and at least one compound selected from the group consisting of a sulfur compound, nitrogen compound and silicon compound;
  (2) roughening the surface portion of the plastics product to be plated and applying a catalyst to the rough-surfaced portion;
  (3) removing the polymer coating from the nonplating surface portion of the plastics product by use of a mixture of equal parts of ethanol and methanol; and
  (4) electrolessly copper plating the plastics product;
  wherein the sulfur compound contained in the masking composition, is at least one compound selected from the group consisting of potassium xanthate, potassium dibutyldithiocarbamate, thiourea, thiourea derivatives, thioethanol, mercaptobenzothiazole, mercaptobenzodiol, thiosemicarbazide, thioglycollic acid and mercaptan;
  wherein the nitrogen compound contained in the masking composition, is at least one compound selected from the group consisting of triazole, benzotriazole and benzotriazole derivatives; and
  wherein the silicon compound contained in the masking composition, is at least one compound selected from the group consisting of mercaptopropyltrimethoxysilane, methyltriethoxysilane, aminosilane, trimethylchlorosilane and vinyltriethoxysilane.

16. The process of claim 15, wherein the masking composition contains at least one solvent selected from the group consisting of ethanol, methanol, isopropanol, methyl ethyl ketone and acetone.

17. The process of claim 15, wherein the masking composition comprises 10 to 50 wt.% of the polymer, 0.1 to 10 wt.% of at least one compound selected from the group consisting of a sulfur compound, nitrogen compound and silicon compound, and the balance a solvent.

18. The process of claim 15, wherein said catalyst is lead.

* * * * *